United States Patent
Boudreau, Jr. et al.

(10) Patent No.: US 10,429,415 B2
(45) Date of Patent: Oct. 1, 2019

(54) METHOD FOR IMPROVING COMMON MODE REJECTION IN A ROGOWSKI COIL-BASED CIRCUIT

(71) Applicant: Landis + Gyr LLC, Lafayette, IN (US)

(72) Inventors: Frank J. Boudreau, Jr., Otterbein, IN (US); Matt Kraus, Jamestown, IN (US)

(73) Assignee: Landis + Gyr LLC, Lafayette, IN (US)

(*) Notice: Subject to any disclaimer, the term of this patent is extended or adjusted under 35 U.S.C. 154(b) by 945 days.

(21) Appl. No.: 14/275,832

(22) Filed: May 12, 2014

(65) Prior Publication Data
US 2014/0333290 A1  Nov. 13, 2014

Related U.S. Application Data

(60) Provisional application No. 61/822,265, filed on May 10, 2013.

(51) Int. Cl.
*G01R 15/18* (2006.01)
(52) U.S. Cl.
CPC .................. *G01R 15/181* (2013.01)
(58) Field of Classification Search
CPC .................................................. G01R 15/18
USPC ........................................................ 324/123
See application file for complete search history.

(56) References Cited

U.S. PATENT DOCUMENTS

| | | | |
|---|---|---|---|
| 4,255,704 A | 3/1981 | Milkovic | |
| 4,495,463 A * | 1/1985 | Milkovic | G01R 21/00 324/127 |
| 5,502,374 A * | 3/1996 | Cota | G01R 15/186 324/119 |
| 5,640,314 A * | 6/1997 | Glasband | H01F 19/04 363/36 |
| 5,933,004 A | 8/1999 | Jackson | |
| 6,121,158 A | 9/2000 | Benchikha | |
| 6,374,188 B1 | 4/2002 | Hubbard | |
| 6,564,159 B1 | 5/2003 | Lavoie | |
| 2006/0037461 A1* | 2/2006 | Yasumura | H01F 3/14 84/730 |
| 2010/0090789 A1* | 4/2010 | Schluter | H01F 30/10 336/192 |
| 2013/0002512 A1* | 1/2013 | Leighton | H01Q 7/08 343/867 |

* cited by examiner

*Primary Examiner* — Akm Zakaria
(74) *Attorney, Agent, or Firm* — Kilpatrick Townsend & Stockton LLP

(57) ABSTRACT

A sensor includes a non-magnetic core having a first winding wrapped thereon. The first winding has a center tap dividing the first winding into a first winding portion and a second winding portion. The center tap is coupled to a reference voltage. The first winding portion and the second winding portion are configured to sense first AC signals, and have a balanced susceptibility to second AC signals. The differential integrating circuit is configured to provide common mode rejection of the second AC signals. The differential integrator circuit is operably coupled to the first winding portion and the second winding portion.

13 Claims, 7 Drawing Sheets

METHOD FOR IMPROVING COMMON MODE REJECTION IN A ROGOWSKI COIL-BASED CIRCUIT

This application claims the benefit of U.S. Provisional Application Ser. No. 61/822,265, filed May 10, 2013, which is incorporated herein by reference.

FIELD OF THE INVENTION

The present invention relates generally to electricity measurements, and more particularly, to current measurements such as those carried out in an electricity meter.

BACKGROUND

One of the goals of electricity metering is to accurately measure the use or consumption of electrical energy resources. With such measurements, the cost of generating and delivering electricity may be allocated among consumers in relatively logical manner. Another goal of electricity metering is help identify electrical energy generation and delivery needs. For example, cumulative electricity consumption measurements for a service area can help determine the appropriate sizing of transformers and other equipment.

Electricity metering often involves the measurement of consumed power or energy in the form of watts or watt-hours. To this end, meters include voltage sensors and current sensors that detect, respectively, the voltage and current delivered to the load. In most cases, the purpose of the voltage sensor is to provide a measurement signal that represents a scaled version of the voltage waveform delivered to the load. Similarly, a current sensor provides a measurement signal that represents a scaled version of the current waveform delivered to the load. In many cases, other circuitry within the meter calculates one or more energy consumption values (kW-hr, VA-hr, etc.) by digitizing the voltage and current measurement signals and performing various known calculations using the digitized measurement signals.

The current measurement in a utility meter can be challenging because a high accuracy is required over a large range, and common current sensor technologies can be susceptible to various sources of error. Present metering technologies involve current transformers, or CTs. Existing CT designs are prone to saturation and may distort causing error especially in a DC magnetic field or with a half wave rectified load. To compensate for such errors, additional circuitry is often required, which increases costs. Such additional circuit can include an additional compensation winding that is used to provide a compensation signal to the CT to improve the accuracy of the signal generated by the main secondary winding. For example, U.S. Pat. No. 4,255, 704 shows a compensation method used in utility metering which involves additional compensation windings and many specialized electronic circuits with precision parts. This requirement makes the manufacture of the specialized metering CT complex and expensive.

One alternative to the ordinary CT is a current sensor that is based on a Rogowski coil, which is a coil wrapped around a non-magnetic core. A Rogowski coil, unlike an ordinary CT, is relatively immune to the negative effects of DC currents, and is immune to constant magnetic fields, such as those associated with permanent magnets. While a current sensor based on Rogowski coil has the advantage of immunity to DC current and permanent magnets, the Rogowski coil has the disadvantage of being particularly sensitive to AC signal coupling.

In particular, FIG. 8 shows a traditional prior art Rogowski coil current sensor topology for use in electricity metering. The current to be measured is represented as the source Ip, and the primary coil, which may suitably be a single turn conductor passing through an opening in the Rogowski coil core, is represented as L1. The winding L2 of the Rogowski coil is, according to the prior art, coupled to the non-inventing input of an amplifier U1, while the inverting input of the amplifier U1 is coupled to a reference voltage. The output OUT is operably coupled to an A/D converter or the like to provide current measurement signals. A capacitor C is coupled in the feedback path from the output OUT to the non-inverting output.

In operation, the Rogowski coil's output is a low level voltage ($\tilde{V}_{RC}$) that is directly proportional to the derivative of the primary side input current ($\tilde{I}_p$). The output voltage is then integrated to recover the phase and amplitude of the primary current. Due to the low voltage levels produced by a Rogowski coil L2, the device is inherently sensitive to near electro-magnetic fields. In particular, nearby AC voltages (shown as VAC) may couple capacitively through $C_e$. This capacitively coupled VAC induces an error current that will result in an offset error out the integrator output.

The error current ($\tilde{I}_e$) due to the capacitive coupling of VAC through $C_e$ will be divided through the secondary of the Rogowski coil (L2) and the resistor R of the integrator connected to the floating ground at inverting terminal of U1. Moreover, the Rogowski coil secondary has a series resistance due the resistance of the wire. Due to the presence of the error current, as the primary current decreases, the signal to noise ratio of the integrator decreases, causing the ratio error to increase. The resistance of the Rogowski coil must be smaller than R by at least 2 to 3 orders of magnitude in order to achieve acceptable accuracy over normal meter temperature ranges. Even then, AC coupling can still be an issue. To address these errors, shielding may be used to block the VAC. Alternatively, software corrections may be employed to correct the offset error. However, such solutions are non-ideal because of complexity and cost, among other things.

A single ended integrator configuration could be improved by increasing the gauge of the wire. Decreasing the resistance by ten will decrease the amplitude of the error voltage by ten. However the size and cost of the Rogowski coil is undesirably increased in such a solution.

There is a need, therefore, for a current sensor arrangement that favorably improves upon one or more of shortcomings of existing transformers, for example, by providing sufficient accuracy under various circumstances while reducing production cost.

SUMMARY

The present invention addresses the above needs as well as others, by providing a Rogowski coil which may be used as a current sensor, and which is configured in a way that allows for better common mode rejection. The common mode rejection operates to reduce or eliminate the undesirable influence of external AC fields on the accuracy of the current measurement. In particular, the at least some embodiments of the invention comprise a Rogowski coil having a core and a coil with a center tap for connecting to a reference voltage. The center-tap wound Rogowski coil may be used, for example, as part of a current sensor in an electricity meter. Other embodiments involve other common-mode rejection circuits coupled to a non-center-tapped Rogowski coil.

One advantage of embodiments of the invention is to improve the rejection of common mode electric fields in Rogowski coils, rendering them more useful in metering applications. At least one embodiment of the invention provides a new way of winding a Rogowski coil to improve rejection of common mode AC fields and to allow the Rogowski coil to interface with an inexpensive single op-amp differential integrator.

In one embodiment, the Rogowski coil may interface with an integrator comprised of two single ended integrators differentially amplified by an instrumentation amplifier. This method will improve common mode rejection at least to some degree over an ordinary differential amplifier.

In another embodiment, shunt resisters may be added across the output of a Rogowski Coil with their common node tied to reference. The lower the value used with the respect to the impedance of the integrating capacitors the better the performance; however there will a decrease in performance over temperature as the values decrease toward the series resistance of the Rogowski coil.

In the above embodiment, the Rogowski coil is a traditional Rogowski coil. In yet another embodiment, the Rogowski coil is center-tapped and coupled to common mode rejection circuit.

The above described features and advantages, as well as others, will become more readily apparent to those of ordinary skill in the art by reference to the following detailed description and accompanying drawings.

DETAILED DESCRIPTION

Figure 1:
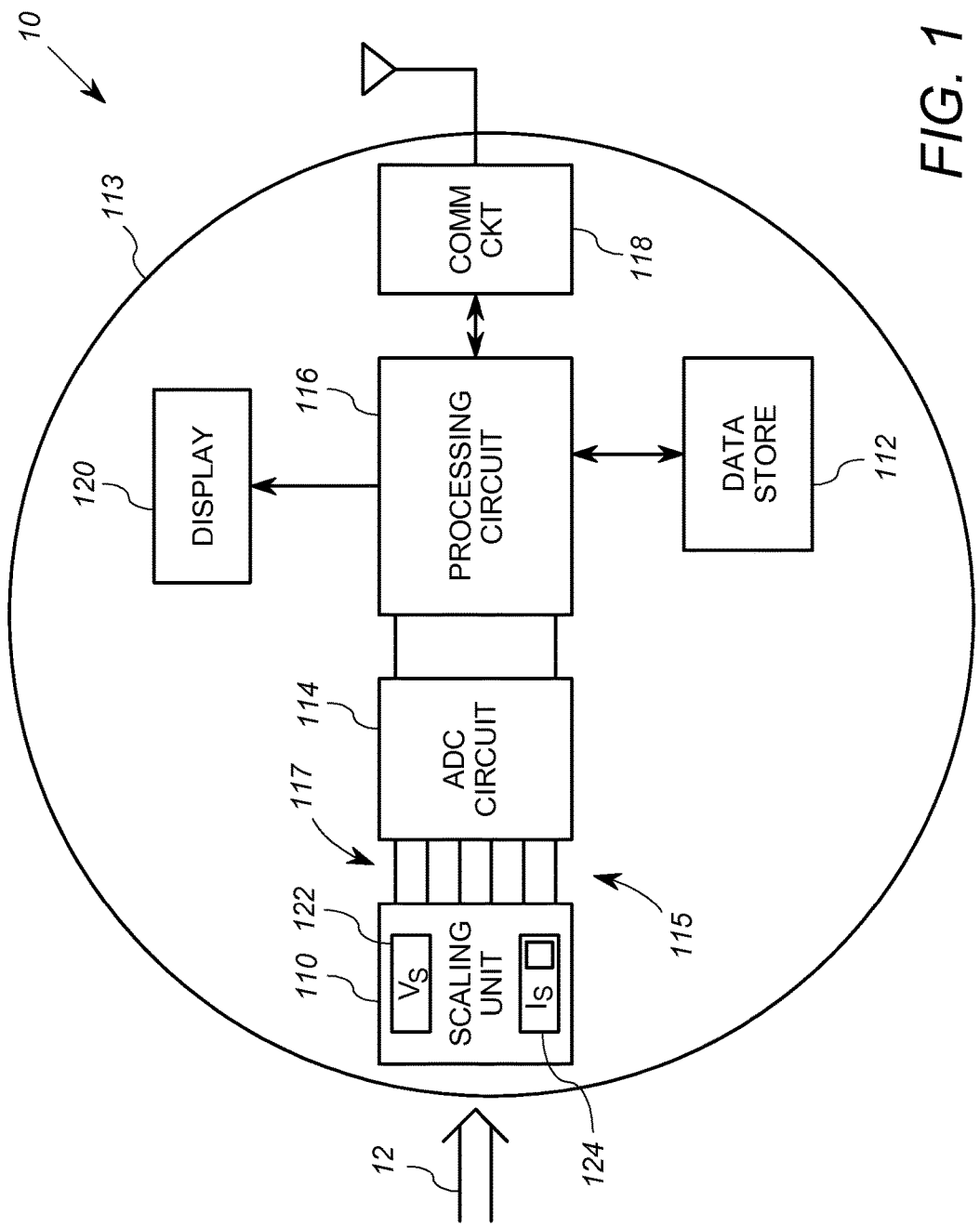
FIG. 1 shows a schematic block diagram of an exemplary polyphase electricity meter 10 in which a sensor arrangement according to one or more embodiments of the invention may be used.

FIG. 1 shows an exemplary embodiment of an exemplary polyphase electricity meter 10 in which a sensor arrangement according to one or more embodiments of the invention may be used. Referring to FIG. 1 specifically, the meter 10 is an apparatus for measuring energy consumption that includes a sensor circuit 110, an analog-to-digital conversion ("ADC") circuit 114, a processing circuit 116, a communication circuit 118, an optional display 120 and a data store 112. All of the above listed elements are preferably supported by a meter housing 113, which may take a plurality of known forms. The communication circuit 118, which is also optional, may be disposed within an interior of the meter housing 113 like the other devices, or may be affixed to the outside of the meter housing 113.

In the embodiment described herein, the sensor circuit 110 and the ADC circuit 114 are collectively arranged to generate digital signals representative of line voltage waveforms $V_A$, $V_B$, $V_C$ for each of three phases A, B, C of a four-wire delta electrical system and other digital signals representative of at least three of the four line current waveforms $I_A$, $I_B$, $I_C$ and $I_N$ of the four-wire delta electrical system. However, the meter 10 may readily be configured for a three-wire delta electrical service, single phase service, as well as other types of electrical service. In any event, the digital signals are typically sequences of digital samples representative of an instantaneous voltage or current measurement on one phase with respect to either neutral or another phase. Circuits capable of generating such signals are known in the art.

The processing circuit 116 is configured to calculate one or more energy consumption values based on the digital signals. The energy consumption values may be communicated to a remote device using the communication circuit 118, displayed using the display 120, stored in the data store 112, or preferably some combination of the foregoing. In accordance with the embodiments described herein, the processing circuit 116 is further operable to perform any or all of the energy consumption calculations typically employed by electricity meters.

In a further detailed description of the meter 10 of FIG. 1, the scaling circuit 110 includes voltage sensors 122 and at least one current sensor 124. The voltage sensors 122, which may, for example, include voltage dividers, generate a scaled down version of the voltage waveform present on phases of the power lines 12. Each of the current sensors 124 is a circuit or arrangement that generates a voltage or current signal that is a scaled down version of the current waveform present on the phases of the power lines 12. In accordance with at least one embodiment of the present invention, each of the current sensors 124, one for each phase A, B and C, has the structure of the current sensor 200 illustrated in FIG. 2.

The ADC circuit 114 includes one or more analog-to-digital converters that convert the scaled measurement signals into digital voltage and current measurement signals. Many circuits capable of generating digital voltage and circuit waveform signals are well known in the art. Suitable examples of analog to digital conversion circuits having such capabilities are described in U.S. Pat. Nos. 6,374,188; 6,564,159; 6,121,158 and 5,933,004, all of which are incorporated herein by reference. Moreover, the ADC circuit 114 may readily be a part of an integrated metering chip package, as will be discussed below.

The processing circuit 116 is a device that employs one or more processing devices such as microprocessors, microcontrollers, digital signal processors, discrete digital circuits and/or combinations thereof. As mentioned above, the processing circuit 116 is operable to generate energy consumption data based on the digital signals. In one example, the processing circuit 116 generates watt-hour information based on an accumulation of products of contemporaneous voltage and current samples. For example, true watt-hours for a particular phase may be calculated as the vector product of the current waveform and the voltage waveform. This vector product may be carried out with sampled voltage ($V_n$) and sampled current ($I_n$) by the formula:

$$Whrs = \Sigma V_n * I_n. \quad (3)$$

where Whrs is an accumulated energy value (i.e. watt-hours) for a time frame from a starting time $n_0$ to a time corresponding to n.

Various processing circuits operable to generate energy consumption data from digital voltage and digital current measurement signals are well known in the art. Suitable examples of such circuits are described in U.S. Pat. Nos. 6,374,188; 6,564,159; 6,121,158 and 5,933,004. However, in one preferred embodiment, the processing circuit is (or includes) a processing element of a metering integrated circuit chip such as the Teridian 71M6533 measurement chip (available from Maxim). In that embodiment, both the ADC circuit 114 and the processing circuit 116 are disposed within the same semiconductor package.

The processing circuit 116 is further operable to store the plurality of energy consumption values in the data store 112. In some embodiments, the processing circuit 116 may store energy consumption values for each of plurality of time periods, in order to allow analysis of energy usage at different times of day, days of the week or month, or even seasonally. The storage of consumption indexed to time periods is often referred to in the industry as "load profiling". The data store 112 may suitably be a random access memory, EEPROM, other memory, or a combination of several types of memory. In still other embodiments, the data store 112 may include a circular buffer, FIFO device, or other memory that stores data in the order in which it is received. Other known methods may be used. In at least some embodiments, the data store 112 includes memory located within the integrated package that houses the processing circuit 116. The data store 112 also includes a software program that is executed by the processing circuit 116 to perform the energy calculations and other functions such as control of communications, displays, and the like.

The communication circuit 118 is a device that is in some embodiments configured to communicate data between the metering unit 12 and one or more remote devices. In a system such as that shown in FIG. 1, the communication circuit 118 is operable to communicate directly or indirectly with a data collection system of a utility service provider. Several of such systems are known. The utility service provider then uses the collected data to generate billing information and/or data forecasting information as is known in the art. To this end, the communication circuit 118 may suitably include a radio, a telephone modem, a power line carrier modem, or other known communication device configured for use with utility meters. Radios may be used that operate in the 100 MHz to 1 GHz range. However, other devices may operate in the kHz or low MHZ range. In addition or in the alternative, the communication circuit 118 is configured to communicate with a locally coupled device, such as a reed switch, portable computing device, or other device. The communication circuit 118 may include an optical or electrical data port, not shown, for this purpose.

The meter display 120, which is optional, may be a digital display such as a liquid crystal display. It will be appreciated that the exact nature of the display is not particularly important to the implementation of the invention. Nevertheless, there is an advantage of including at least some display capabilities. LCD displays, moreover, have been found to have a particularly advantageous set of qualities for use in electronic meters.

Figures 2, 3:
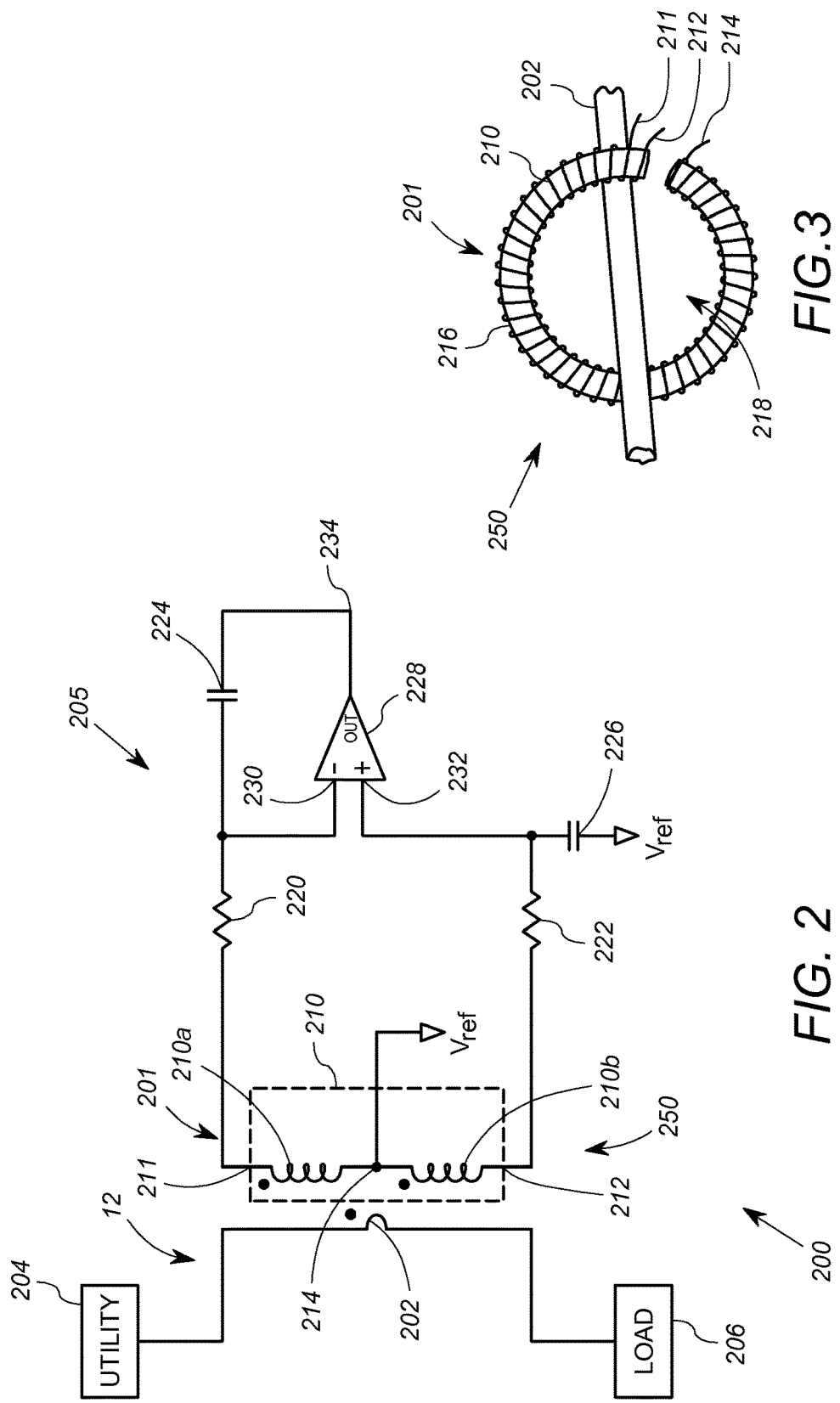
FIG. 2 shows a schematic block diagram of a sensor according to a first embodiment of the present invention that may be used in the meter of FIG. 1.
FIG. 3 shows a schematic representative diagram of an exemplary Rogowski coil that may be used in the sensor of FIG. 2

FIG. 2 shows a schematic diagram of a current sensor 200 according to an embodiment of the invention that is operably coupled to measure current on a single phase of a power line 12, and is further operably coupled to provide a current measurement signal representative of the measured current to the ADC circuit 114 of FIG. 1.

The power line 12 is coupled into the current sensor 200 by a current coil 202. As is known in the art, utility power lines 204 are typically coupled to a customer load 206 via the current coil 202. Thus, the current coil 202 is an elongate conductor, such as a conductive bar, that carries all (or a large proportion) of the current delivered to a customer load 206 from the utility 204 on the power line 12. The current coil 202 is supported by the meter housing 113 (see FIG. 1).

As shown schematically in FIG. 2, the current sensor 200 includes a Rogowski coil 201 (or other non-magnetic core device) having a winding 210 having a first end 211 and a second end 212. In general, the Rogowski coil 201 and the current coil 202 cooperate to form a transformer 250. FIG. 3 shows a representative diagram of the transformer 250. As shown in FIG. 3, the Rogowski coil 201 includes a non-magnetic core 216 around which is wrapped the winding 210.

The core 216 may take any suitable form but preferably has a central opening 218 through which the current coil 202 passes, such that the winding 210 on the core 216 substantially surrounds the current coil 202. To this end, the core 216 may be any non-magnetic disc, ring or other element. The core 216 may be constructed of plastic, non-magnetic ceramic, glass or aluminum, by way of non-limiting example.

The current coil 202 forms a primary winding of the transformer 250, and the winding 210 of the Rogowski coil 201 forms a secondary winding of the transformer 250. It will be appreciated that the geometry of the current coil 202 and the Rogowski coil 201 may take other suitable forms in the transformer 250 for current sensing purposes.

Referring again FIGS. 2 and 3, the Rogowski coil winding 210 has a center tap 214 connected to a reference voltage $V_{ref}$. The center tap 214 effectively divides the Rogowski coil winding 210 into equivalent coil or winding portions 210a, 210b. The winding portions 210a, 210b may suitably be configured as a bifilar winding. However, any configuration that renders the winding portions 210a, 210b to balanced, equal or proportional susceptibility to external AC voltages may be employed. In this embodiment, an end of the winding portion 210a forms the first end 211 of the coil winding 210, and an end of the winding portion 210b forms the second end 212 of the coil winding 210. The center tap 214 defines the other ends of the winding portions 210a, 210b.

As shown in FIG. 2, the current sensor 200 further comprises a differential integrator circuit 205, which may suitably be a single operational amplifier differential integrator. To this end, the differential integrator 205 in this embodiment comprises two resistors 220, 222, two capacitors 224, 226, and an operational amplifier (op-amp) 228. The output of the op-amp 228 may be operably connected to the ADC circuit 114 (see FIG. 1), either directly or via other buffer elements or circuits. The resistor 220 is series coupled between the winding portion 210a and an inverting input 230 of the op-amp 228. The resistor 222 is series coupled between the winding portion 210b and the non-inverting input 232 of the op-amp 228. The resistors 220, 222 have substantially the same resistance value. By substantially the same, for example, the resistors 220, 222 may have resistances that vary within a tolerance level. The capacitor 224 is coupled between the output 234 of the op-amp 228 and the inverting input 230, and the capacitor 226 is coupled between the reference voltage $V_{ref}$ (the same as that to which the center tap 214 is connected) and the non-inverting input 232 of the op-amp 228. The capacitors 224, 226 have substantially the same capacitance value. By substantially the same, for example, it is meant that the capacitances may vary within a tolerance level.

It will be appreciated that the arrangement of the Rogowski coil may take other forms in some embodiments. In general, the other forms provide various trade-offs between cost and complexity versus performance and configurability.

In operation, current $I_{load}$ flowing from the utility 204 to the load 206 flows through the current coil 202. Through the operation of the Rogowski coil-based transformer 250, the current $I_{load}$ imposes a sense current $I_{sense}$ on the coil winding 210. The sense current $I_{sense}$ has the characteristics of a differentiated, scaled-down version of $I_{load}$. Due to the orientation of the windings as indicated FIG. 2, the full signal $I_{sense}$ is provided to the differential integrator 205, and more specifically across the differential inputs 230, 232 of the op-amp 228 via the resistors 220, 222. The signal at the output 234 represents the sensed current $I_{load}$, and is provided directly or indirectly (via a shunt resistor, for example) to the ADC 114 of FIG. 1.

The above circuit also operates to provide common mode rejection to capacitively coupled external AC signals. To this end, due to the balanced or equivalent susceptibility to the capacitive coupling of undesirable external AC signals, the undesirable signals are coupled via both winding portions 210a, 210b more or less equally. Thus, the differential integrator 205 provides common-mode rejection of the imposed voltage, thereby increasing the accuracy of the signal $I_{sense}$ as a measurement of $I_{load}$.

Figure 4:
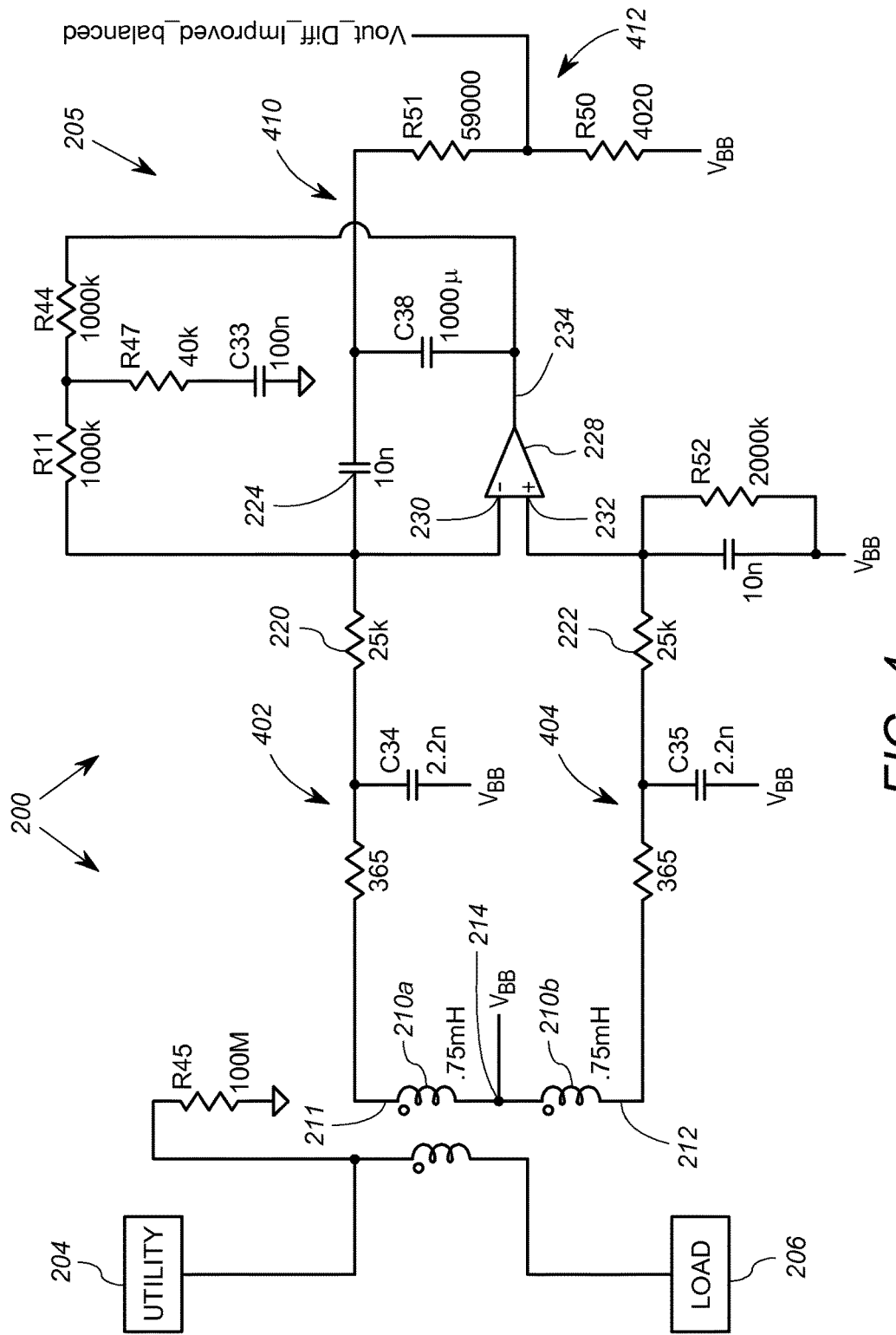
FIG. 4 shows a schematic diagram of a detailed example of the sensor of FIG. 2.

FIG. 4 shows a more detailed exemplary implementation of the sensor 200. It will be appreciated that other variations of a detailed implementation can nevertheless obtain the advantages of the invention. The detailed implementation of FIG. 4 is particularly useful in obtaining a suitable current measurement signal output for use by a metering circuit AD converter such as the ADC circuit 114 of FIG. 1. It will be appreciated that like reference numbers are used on like components in FIGS. 2, 3 and 4.

In addition to the basic components of FIG. 2, a high resistance (e.g. 100 MΩ) resistor R45 is coupled between one end of the current coil 202 and ground. In this embodiment, each of the bifilar winding portions 210a and 210b has an inductance of 0.75 mH, the resistors 220, 222 have resistances of 25 kΩ, and the capacitors 224, 226 have capacitances of 10 nF. The center tap 214 is operably coupled to the reference voltage VBB. The embodiment of FIG. 4 also includes a low pass filter 402 coupled between the first end 211 of the winding 210 and the resistor 220, and a low pass filter 404 coupled between the second end 212 of the winding 210 and the resistor 222. Each of the filters 402, 404 may suitably have a cut-off frequency of on the order of 200 kHz.

In addition, the differential integrator circuit 205 further includes an additional capacitor C36 (of capacitance approximately $\frac{1}{10}^{th}$ of that of capacitors 224, 226) series coupled between the output 234 of the op amp 228 and an output node 410. The capacitor C36 helps to remove DC offset from the output. The differential integrator circuit 205 also includes resistors R11, R44, R47, and capacitor C33. The resistors R11 and R44, which may suitably be 1 MΩ each, are series coupled between the output 234 of the op-amp 228 and the inverting input 230. The resistor R47, which may suitably be 40 kΩ, is series connected to the capacitor C33, which may suitably be 10 nF, to form a branch that is coupled between a ground and a node between the resistors R11 and R44. This branch helps improve the low frequency AC performance. The integrator 205 in this embodiment may suitably have a gain of 10.6.

The output line 410 is further coupled to a voltage divider 412 which formulates a voltage-based output signal having a voltage waveform representative of the input current waveform.

Figure 5:
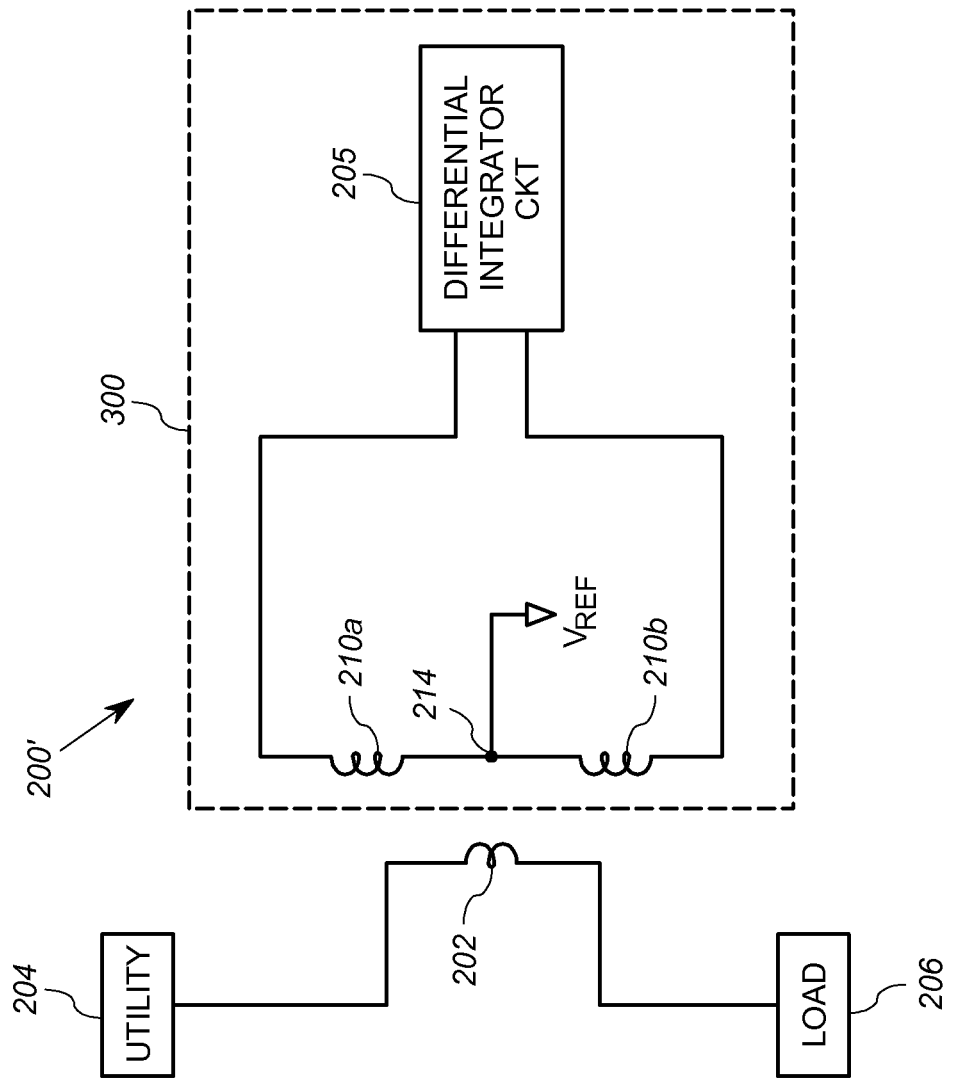
FIG. 5 shows a schematic block diagram of a first alternative embodiment of a sensor that may be used in the meter of FIG. 1.

FIG. 5 shows a first alternative embodiment of the sensor 200' that includes similar winding portions 210a, 210b, a center tap conductor 214, and differential integrator 205. However, the sensor 200' includes a Faraday shield 300 that is interposed between the current coil 202 and at least the winding 210. The Faraday shield provides additional protection against AC fields, and preferably encloses the entire sensor 200'.

Figure 6:
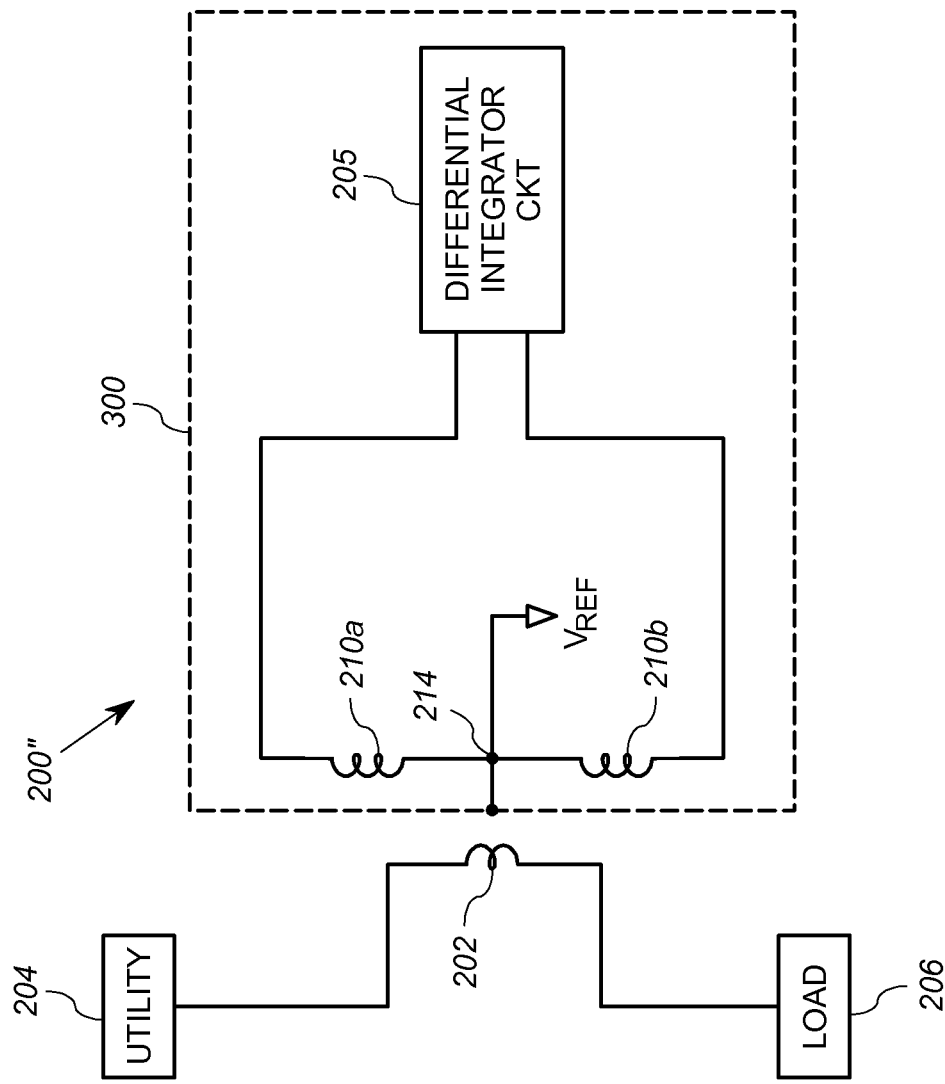
FIG. 6 shows a schematic block diagram of a second alternative embodiment of a sensor that may be used in the meter of FIG. 1.

FIG. 6 shows a schematic block diagram of a second alternative embodiment of the sensor 200''. The sensor 200'' is identical to the sensor 200' of FIG. 5, except that the Faraday shield 300 is further coupled to the center tap conductor 214.

Figure 7:
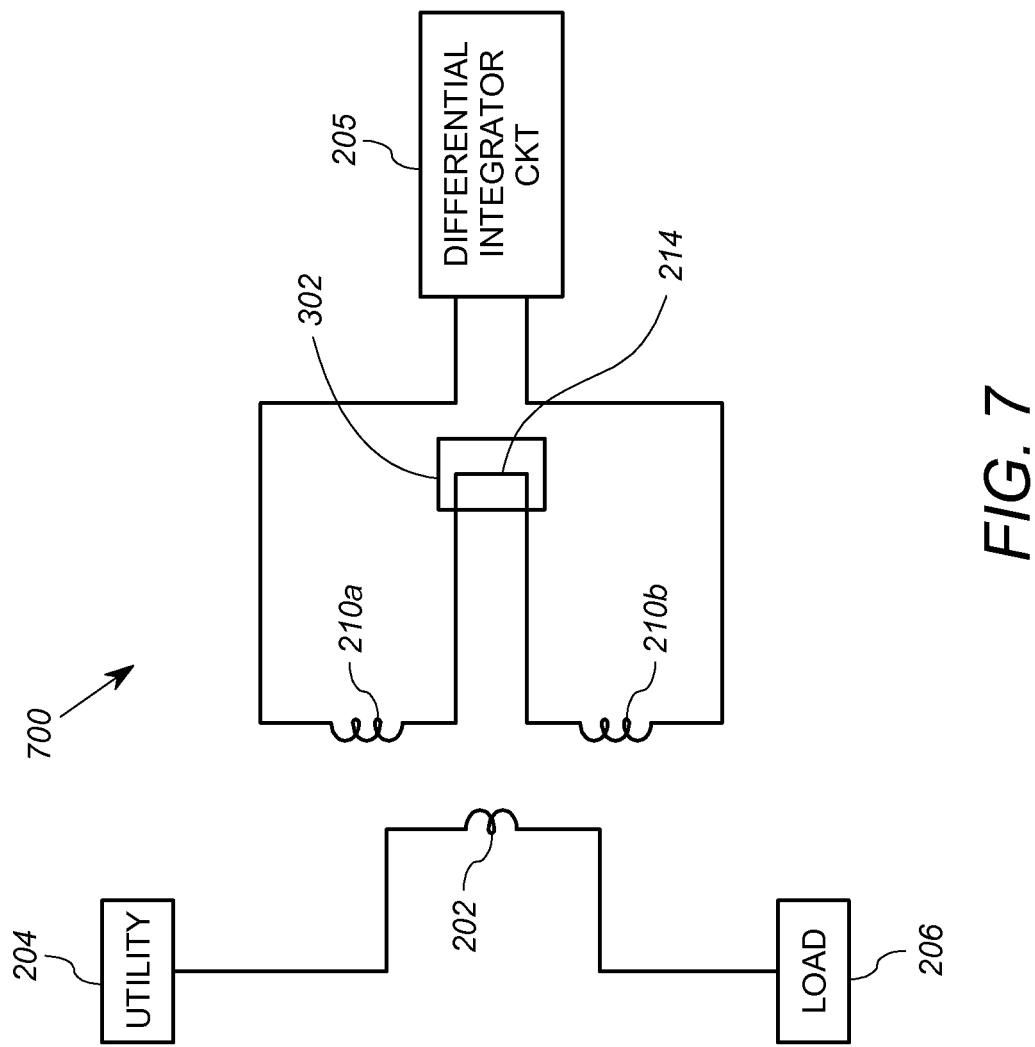
FIG. 7 shows a schematic block diagram of a third alternative embodiment of a sensor that may be used in the meter of FIG. 1.
Figure 8:
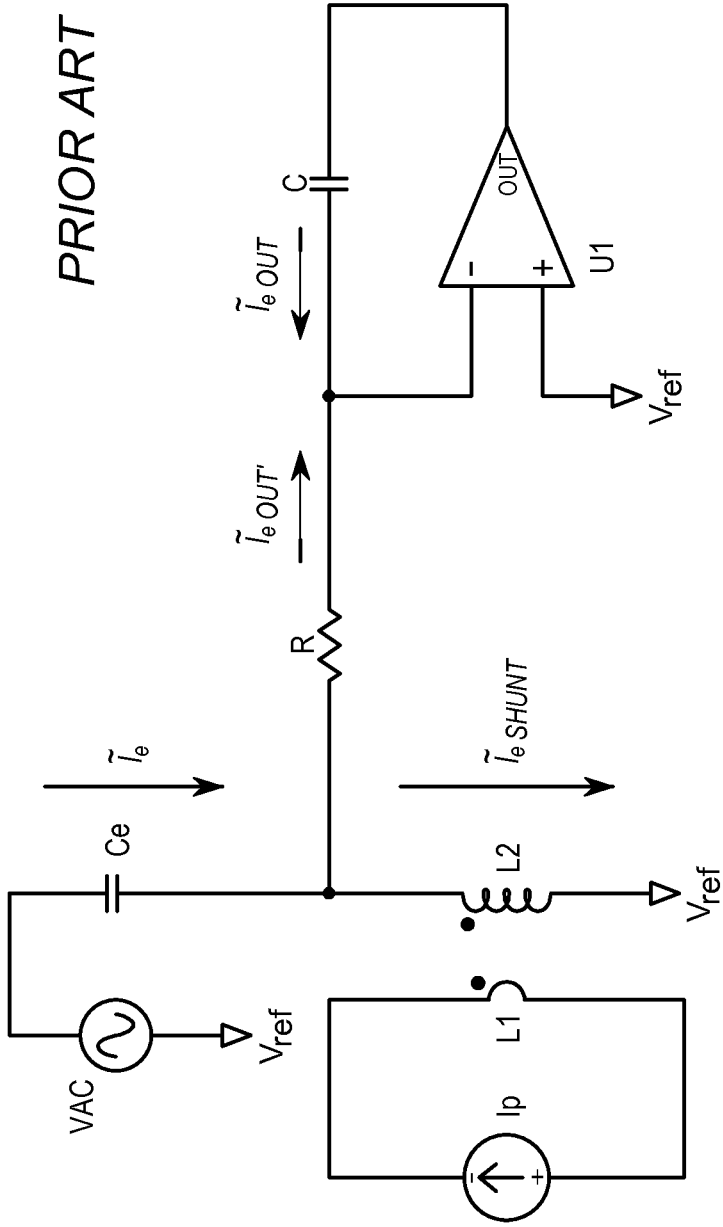
FIG. 8 shows a schematic diagram of prior art sensor arrangement using a Rogowski coil with an equivalent circuit of an external AC noise source capacitively coupled to the sensor arrangement.

FIG. 7 shows a schematic block diagram of a third alternative embodiment of the sensor 700. The sensor 700 is similar to the sensor 200' of FIG. 5, that of FIG. 3, except that the center tap connection between winding portions 210a, 210b occurs external to the coil structure, such as on a circuit board 302, which is located within the meter 10 (and supported by the meter housing 113), or other device.

Each of the embodiments of FIGS. 5 through 7 may be used as an alternative to the Rogowski coil sensor 200 shown in FIG. 2 or 4.

It will be appreciated that other embodiments may employ a type of common mode rejection circuit other than the differential integrator circuit 205 of FIG. 2. For example, a differential integrator using common mode rejection and having more than a single op-amp may be employed. In one embodiment, the differential integrator circuit 205 comprises a three op-amp integrator.

It will be appreciated that the above-described embodiments are merely illustrative, and that those of ordinary skill in the art may readily develop their own implementations and modifications that incorporate the principles of the present invention and fall within the spirit and scope thereof.

We claim:
1. A sensor for use in an electricity meter comprising:
a non-magnetic core having a first winding wrapped thereon, the first winding having a center-tap coupled to a reference voltage; and
a common mode rejection circuit operably coupled to the first winding, the common mode rejection circuit operably coupled to reference the reference voltage, the common mode rejection circuit comprising
a differential amplifier having a first input, a second input and an output;
a first resistive path coupled from a first end of the first winding to the first input;
a second resistive path coupled from a second end of the first winding to the second input;
a first capacitive path coupled from the first input to the output;

a second capacitive path coupled from the second input to the reference voltage.

2. The sensor of claim 1, wherein:
the first resistive path and the second resistive path have substantially similar resistance values; and
the first capacitive path and the second capacitive path have substantially similar capacitance values.

3. A sensor for use in an electricity meter comprising:
a non-magnetic core having a first winding wrapped thereon, the first winding having a center-tap coupled to a reference voltage; and
a common mode rejection circuit operably coupled to the first winding, the common mode rejection circuit operably coupled to the reference voltage, wherein the common mode rejection circuit includes a single op-amp differential integrator circuit.

4. The sensor of claim 3, wherein the single op-amp differential integrator circuit comprises:
a differential amplifier having a first input, a second input and an output;
a first resistor coupled between a first end of the first winding and the first input;
a second resistor coupled between a second end of the first winding and the second input;
a first capacitor coupled between the first input and the output;
a second capacitor coupled between the second input and the reference voltage.

5. The sensor of claim 4, wherein:
the first resistor and the second resistor have substantially similar resistances; and
the first capacitor and the second capacitor have substantially similar capacitances.

6. The sensor of claim 3, wherein the core includes a central opening for receiving a current coil of an electricity meter, and wherein the first winding is configured to sense AC signal current of the first AC signals flowing on the current coil.

7. An arrangement for use in an electricity meter, comprising:
a current coil operably coupled to receive power line current provided to a load, the current coil supported by a meter housing;
a non-magnetic core having a first winding wrapped thereon, the first winding having a center-tap coupled to be at a reference voltage; the first winding configured to sense the power line current on the current coil and generate a current measurement signal therefrom; and
a common mode rejection circuit operably coupled to the first winding, the common mode rejection circuit operably coupled receive the current measurement signal and to generate an output signal representative of the power line current, the common mode rejection circuit including a differential amplifier having a first input, a second input and an output, and a capacitive path from the second input to the reference voltage, wherein the capacitive path taken apart from all other elements of the arrangement has a transfer function that is capacitive in behavior.

8. The arrangement of claim 7, wherein the common mode rejection circuit comprises:
a first resistor coupled between a first end of the first winding and the first input;
a second resistor coupled between a second end of the first winding and the second input; and
a first capacitor coupled between the first input and the output.

9. The arrangement of claim 8, wherein:
the first resistor and the second resistor have substantially similar resistances; and
the first capacitor and the second capacitor have substantially similar capacitances.

10. The arrangement of claim 7, wherein the core includes a central opening, and wherein the current coil extends through the central opening.

11. The arrangement of claim 10, wherein the common mode rejection circuit includes a differential integrator circuit.

12. The arrangement of claim 10, wherein the common mode rejection circuit includes a single op-amp differential integrator circuit having the first input, the second input, and the output.

13. The arrangement of claim 7, further comprising a Faraday shield disposed proximate to the first winding, and wherein the Faraday shield is at the reference voltage.

* * * * *